(12) United States Patent
Watanabe

(10) Patent No.: US 12,745,647 B2
(45) Date of Patent: Sep. 22, 2026

(54) HIGH FREQUENCY TRANSISTOR

(71) Applicant: Mitsubishi Electric Corporation, Tokyo (JP)

(72) Inventor: Shinsuke Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 350 days.

(21) Appl. No.: 18/617,242

(22) Filed: Mar. 26, 2024

(65) Prior Publication Data

US 2025/0246559 A1 Jul. 31, 2025

(30) Foreign Application Priority Data

Jan. 29, 2024 (JP) ................................ 2024-010909

(51) Int. Cl.
*H10W 44/20* (2026.01)
*H10W 72/20* (2026.01)
*H10W 90/00* (2026.01)

(52) U.S. Cl.
CPC ........... *H10W 44/20* (2026.01); *H10W 90/00* (2026.01); *H10W 72/252* (2026.01); *H10W 90/725* (2026.01); *H10W 90/794* (2026.01)

(58) Field of Classification Search
None
See application file for complete search history.

(56) References Cited

U.S. PATENT DOCUMENTS 9,887,284 B1 2/2018 Watanabe et al.
10,937,754 B1 * 3/2021 Yang ..................... H10W 72/50
2015/0381121 A1 * 12/2015 Jones ........................ H03F 3/21 257/532
2016/0247798 A1 * 8/2016 Sasaki .................. H10D 84/206
(Continued)

FOREIGN PATENT DOCUMENTS

CN 112310074 B * 8/2024 ............ H10W 70/65
CN 111726088 B * 9/2024 .......... H10W 42/276
(Continued)

OTHER PUBLICATIONS

DE-102012211690-A1 Machine Translation (Year: 2026).*
DE-102017213144-B4 Machine Translation (Year: 2026).*
JP-H08139543-A Machine translation (Year: 2026).*

*Primary Examiner* — Michael Lebentritt
(74) *Attorney, Agent, or Firm* — Studebaker Brackett PLLC

(57) ABSTRACT

Unit transistors are provided on a semiconductor substrate and connected in parallel to one another. Capacitors are respectively connected to gate electrodes of the unit transistors. Resistors are respectively connected to the capacitors in parallel. First and second pads are provided on an upper surface of the semiconductor substrate and respectively connected to one end and the other end of the resistor connected to at least the unit transistor in the center among the unit transistors arranged in a row. First and second conductors are provided on a silicon substrate arranged above the semiconductor substrate. A first bump connects
(Continued)

the first pad and one end of the first conductor. A second bump connects the second pad and one end of the second conductor. The other ends of the first and second conductors are set in contact with the silicon substrate and are separated from and face each other.

8 Claims, 6 Drawing Sheets

(56) References Cited

U.S. PATENT DOCUMENTS

| | | | | |
|---|---|---|---|---|
| 2021/0091723 | A1 | 3/2021 | Yoshioka | |
| 2021/0313284 | A1* | 10/2021 | Noori | H10W 44/20 |
| 2021/0313286 | A1* | 10/2021 | Watts | H10W 20/484 |
| 2021/0376807 | A1* | 12/2021 | Lim | H03F 3/72 |
| 2022/0084950 | A1* | 3/2022 | Noori | H10W 70/614 |
| 2023/0282726 | A1* | 9/2023 | Hung | H10D 1/045 |
| 2024/0105692 | A1* | 3/2024 | Wah | H10W 40/778 |

FOREIGN PATENT DOCUMENTS

| | | | | | |
|---|---|---|---|---|---|
| CN | 118712172 | A | * | 9/2024 | H10W 90/00 |
| DE | 102012211690 | A1 | * | 2/2013 | H10W 44/401 |
| DE | 102017213144 | B4 | * | 5/2021 | H10W 74/111 |
| EP | 3160043 | B1 | * | 3/2021 | H10W 72/075 |
| JP | H08139543 | A | * | 5/1996 | |
| JP | 2003077931 | A | * | 3/2003 | |
| JP | 2010118534 | A | * | 5/2010 | H10W 72/072 |
| JP | 2013-207408 | A | | 10/2013 | |
| JP | 2017045797 | A | * | 3/2017 | H10P 30/20 |
| JP | 6399267 | B1 | | 10/2018 | |
| JP | 6658441 | B2 | | 3/2020 | |
| TW | I779569 | B | * | 10/2022 | H10W 72/60 |
| TW | 202414601 | A | * | 4/2024 | H10W 20/20 |
| WO | WO-2022259923 | A1 | * | 12/2022 | H10W 90/00 |
| WO | WO-2023210163 | A1 | * | 11/2023 | H03F 3/19 |

* cited by examiner

FIG. 6

HIGH FREQUENCY TRANSISTOR

BACKGROUND OF THE INVENTION

Field

The present disclosure relates to a high frequency transistor for amplifying a high frequency signal.

Background

In recent years, an increase in capacity in information communication using a high frequency signal, a frequency of which is 1 gigahertz or higher, an increase in resolution in radar, and improvement of a detection distance for a search object have been advanced. There has been demanded an increase in performance of a high frequency transistor used as an amplifier in communication equipment and a radar apparatus in the information communication and the radar. The high frequency transistor is requested to improve a gain, which is a power amplification factor, saturated output power, power added efficiency, and the like of the high frequency signal. If the gain of the high frequency transistor is low, a driver amplifier that amplifies, in advance, the power of a high frequency signal input to the high frequency transistor is necessary. If the gain of the high frequency transistor can be improved, the number of driver amplifiers can be reduced and simplification and a cost reduction for the communication equipment and the radar apparatus can be achieved. To amplify the high frequency signal, it is necessary to apply a DC bias voltage to the high frequency transistor and supply DC power. Not all of the supplied DC power is converted into energy of the high frequency signal. Most of the supplied DC power changes to thermal energy. Therefore, the communication equipment and the radar apparatus require cooling apparatuses that cools the high frequency transistor. If the power added efficiency of the high frequency transistor can be improved, a ratio of the supplied DC power changing to the thermal energy can be reduced and the cooling apparatuses can be reduced. This makes it possible to achieve a reduction in the costs and a reduction in the sizes of the communication equipment and the radar apparatus.

In the high frequency transistor having the high gain, oscillation sometimes occurs only if the DC bias voltage is applied even if the high frequency signal is not input. As a result, an unnecessary high frequency signal occurs and hinders operations of the communication equipment and the radar apparatus. Therefore, as a stabilization circuit, a CR circuit in which a resistor and a capacitor are connected in parallel is connected to gate electrodes of transistors. The stabilization circuit intentionally reduces the gain of the high frequency transistor and suppresses the oscillation.

A plurality of unit transistors connected in parallel to one another are provided on a semiconductor substrate. Usually, several transistors among the plurality of transistors are collectively treated as one block. A gate wire functioning as an input terminal for an electric signal is connected to each block. The block is referred to as unit transistor below.

If characteristics of the plurality of unit transistors are different from one another, high frequency signals output from the plurality of unit transistors cannot be appropriately combined, causing deterioration in the saturated output power and the power added efficiency. Therefore, the plurality of unit transistors desirably has the same characteristics and uniformly operate. However, if a large-power high frequency signal is input, the unit transistor generates heat and temperature rises. The unit transistor generating heat heats the other unit transistors around the unit transistor. This causes a nonuniform temperature distribution in which the unit transistor arranged in the center has high temperature and the unit transistors at both the ends have low temperature. Since characteristics of a transistor changes according to temperature, the plurality of unit transistors nonuniformly operate and cause deterioration in the power added efficiency and the like. If the nonuniformity of the temperatures becomes marked, the unit transistor in the center has extremely high temperature and can be damaged.

In contrast, it has been proposed to change a resistance value of the stabilization circuit for each of the unit transistors (see, for example, Patent Literature 1). By reducing a resistance value of the stabilization circuit of the unit transistor in the center and further attenuating the electric power of the high frequency signal, it is possible to suppress the heat generation of the unit transistor in the center and uniformize the temperatures of the plurality of unit transistors.

Citation List

Patent Literature

Patent Literature 1: Japanese Patent No. 6399267.

SUMMARY

Technical Problem

However, a rising amount of the temperature of a transistor is different depending on situations such as an applied voltage and an environmental temperature. Therefore, changing the resistance value of the stabilization circuit for each of the unit transistors is likely to worsen a nonuniform operation of the transistor.

It has also been proposed to provide bias circuits respectively in the plurality of unit transistors and incorporate thermistors in the unit transistors. Since the bias circuits change a gate bias voltage according to temperature detected by the thermistors, it is expected that high frequency transistors that uniformly operate can be implemented. However, because of the physical size of the unit transistors themselves, it is difficult to arrange the thermistors immediately near a heat generation part. The addition of the thermistors increases the area of an expensive semiconductor substrate of silicon carbide, gallium nitride, or the like. If the bias circuits and the thermistors are provided in the unit transistors, the substrate area is markedly increased. Since different bias circuits need to be provided respectively in the plurality of unit transistors, the bias circuits have to be formed in a specific configuration. Therefore, there has been a problem in that costs greatly rise.

The present disclosure has been devised in order to solve the problems described above, and an object of the present disclosure is to obtain a high frequency transistor that can improve transistor performance while suppressing a cost increase.

Solution to Problem

A high frequency transistor according to the present disclosure includes: a semiconductor substrate; a plurality of unit transistors provided on the semiconductor substrate and connected in parallel to one another; a plurality of capacitors respectively connected to gate electrodes of the plurality of unit transistors; a plurality of resistors respectively connected to the plurality of capacitors in parallel; first and second pads provided on an upper surface of the semiconductor substrate and respectively connected to one end and the other end of the resistor connected to at least the unit transistor in the center among the plurality of unit transistors arranged in a row; a silicon substrate arranged above the semiconductor substrate; first and second conductors provided on the silicon substrate; a first bump connecting the first pad and one end of the first conductor; and a second bump connecting the second pad and one end of the second conductor, wherein the other end of the first conductor and the other end of the second conductor are set in contact with the silicon substrate and are separated from and face each other.

Advantageous Effects of Invention

In the present disclosure, the other end of the first conductor and the other end of the second conductor are electrically connected to each other via the silicon substrate heated by heat from the corresponding unit transistor. Accordingly, since the path is connected in parallel to the resistor, the resistance value of the resistor configuring the stabilization circuit decreases and the high frequency signal further attenuates. Since this operation more conspicuously occurs in the unit transistor in the center having high temperature and the stabilization circuit of the unit transistor, the plurality of unit transistors approach the same temperature. Therefore, it is possible to suppress nonuniformity of the temperatures of the plurality of unit transistors. Accordingly, it is possible to improve transistor performance while suppressing a cost rise.

BRIEF DESCRIPTION OF DRAWINGS

FIG. 6 is a bottom view illustrating a silicon substrate according to the second embodiment.

DESCRIPTION OF EMBODIMENTS

A high frequency transistor according to the embodiments of the present disclosure will be described with reference to the drawings. The same components will be denoted by the same symbols, and the repeated description thereof may be omitted.

First Embodiment

Figure 1:
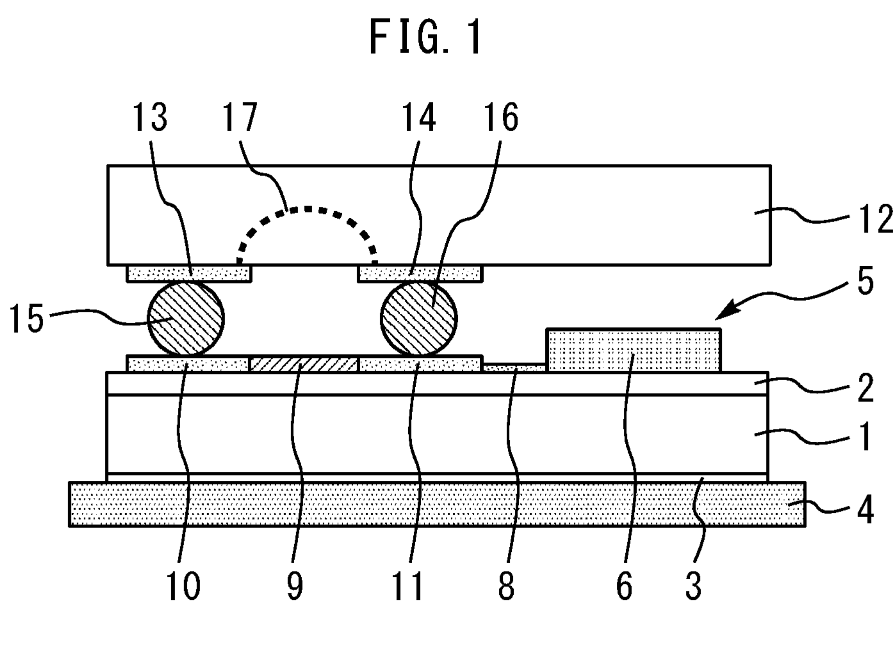
FIG. 1 is a sectional view illustrating a high frequency transistor according to a first embodiment.
Figure 2:
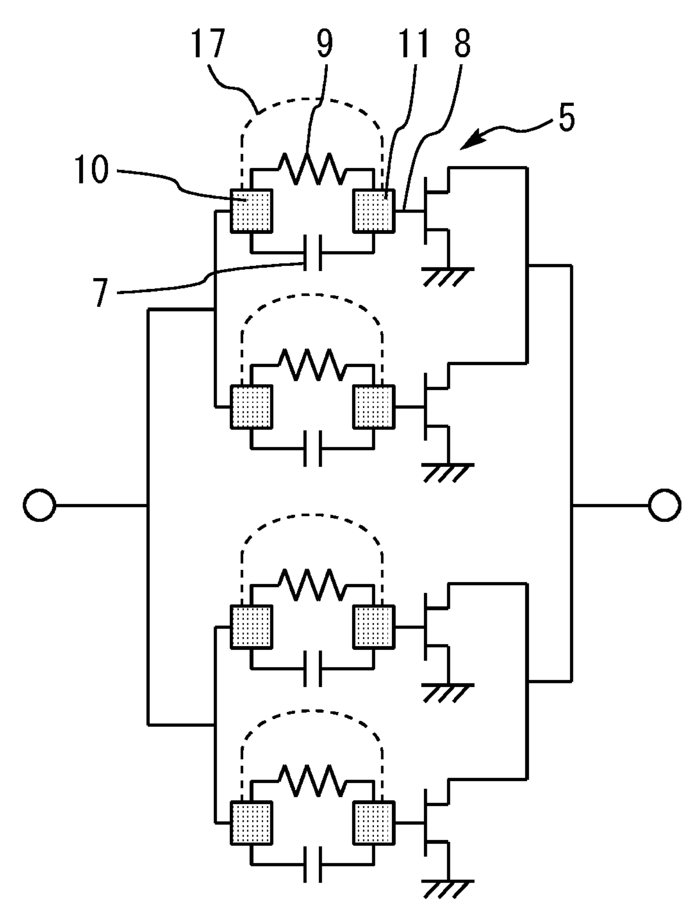
FIG. 2 is a circuit diagram of the high frequency transistor according to the first embodiment.

FIG. 1 is a sectional view illustrating a high frequency transistor according to a first embodiment. FIG. 2 is a circuit diagram of the high frequency transistor according to the first embodiment.

A semiconductor layer 2 is formed on a semiconductor substrate 1. The material of the semiconductor substrate 1 is silicon, silicon carbide, gallium arsenide, gallium nitride, or the like. For example, the semiconductor substrate 1 is a silicon carbide substrate and the semiconductor layer 2 is a gallium nitride layer. The semiconductor substrate 1 is mounted on ground metal 4 of a package by solder 3.

A plurality of unit transistors 5 are provided on the semiconductor layer 2 on the semiconductor substrate 1. The plurality of unit transistors 5 are connected in parallel to one another. In FIG. 2, four unit transistors 5 are connected in parallel. Each of the unit transistors 5 is a high electron mobility transistor, a metal-oxide-semiconductor field-effect transistor, or the like.

The unit transistor 5 includes a gate electrode 6, a drain electrode, and a source electrode provided on the semiconductor layer 2. The gate electrode 6 is arranged between the drain electrode and the source electrode. The gate electrode 6, the drain electrode, and the source electrode are formed of metal such as gold on the semiconductor layer 2 by a vacuum vapor deposition method or a sputtering method.

A plurality of capacitors 7 are respectively connected to gate electrodes 6 of the plurality of unit transistors 5 via gate wires 8. A plurality of resistors 9 are respectively connected to the plurality of capacitors 7 in parallel. A CR circuit in which the capacitors 7 and the resistors 9 are connected in parallel functions as a stabilization circuit that suppresses oscillation.

Pads 10 and 11 are provided on the upper surface of the semiconductor substrate 1 and respectively connected to one end and the other end of the resistor 9. A silicon substrate 12 is arranged above the semiconductor substrate 1. Pads 13 and 14 are provided on the silicon substrate 12. A gold bump 15 connects the pad 10 and the pad 13. A gold bump 16 connects the pad 11 and the pad 14. The pads 13 and 14 are in contact with the lower surface of the silicon substrate 12 and are separated from and face each other. The interval between the pads 13 and 14 is approximately the same as the length of the resistor 9 and is, for example, 10 microns or more and 300 microns or less. The pads 10, 11, 13, and 14 are made of the same metal as the gate wires 8.

Since the silicon substrate 12 is used as a lid of a wafer-level chip-size package unlike a substrate used in a CMOS and the like, impurities are not intentionally added to the silicon substrate 12. Therefore, since the silicon substrate 12 at the normal temperature is insulative, an electric current does not flow between the pads 13 and 14 even if a high frequency signal or a bias voltage is input to the pads 10 and 11. On the other hand, if the silicon substrate 12 is heated by the unit transistor 5 having high temperature, the silicon substrate 12 becomes nearly conductive. Therefore, a path 17 on which an electric signal passes as indicated by a dotted line in FIG. 1 is formed on the surface layer of the silicon substrate 12 between the pads 13 and 14. Accordingly, since the path 17 is connected in parallel to the resistor 9, a resistance value of a resistor configuring the stabilization circuit decreases.

If the resistance value of the resistor of the stabilization circuit is high, an input high frequency signal preferentially passes through the capacitor 7 having a small loss. Accordingly, the unit transistor 5 corresponding to the capacitor 7 maintains a high gain. On the other hand, if the resistance value of the resistor of the stabilization circuit is low, the input high frequency signal preferentially passes through the resistor and attenuates. The unit transistor 5 corresponding to the resistor has a low gain.

Figure 3:
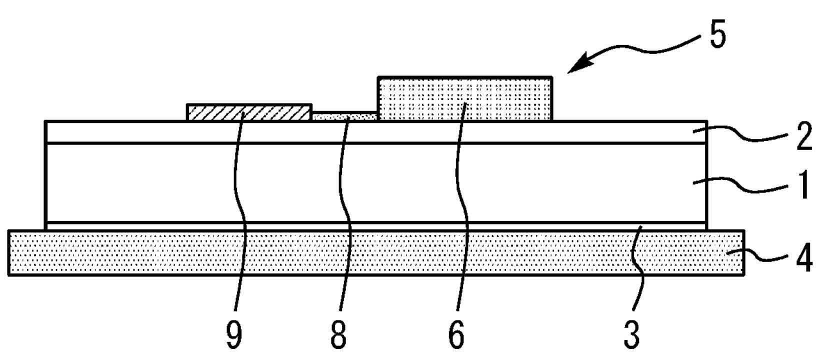
FIG. 3 is a sectional view illustrating a high frequency transistor according to the comparative example.
Figure 4:
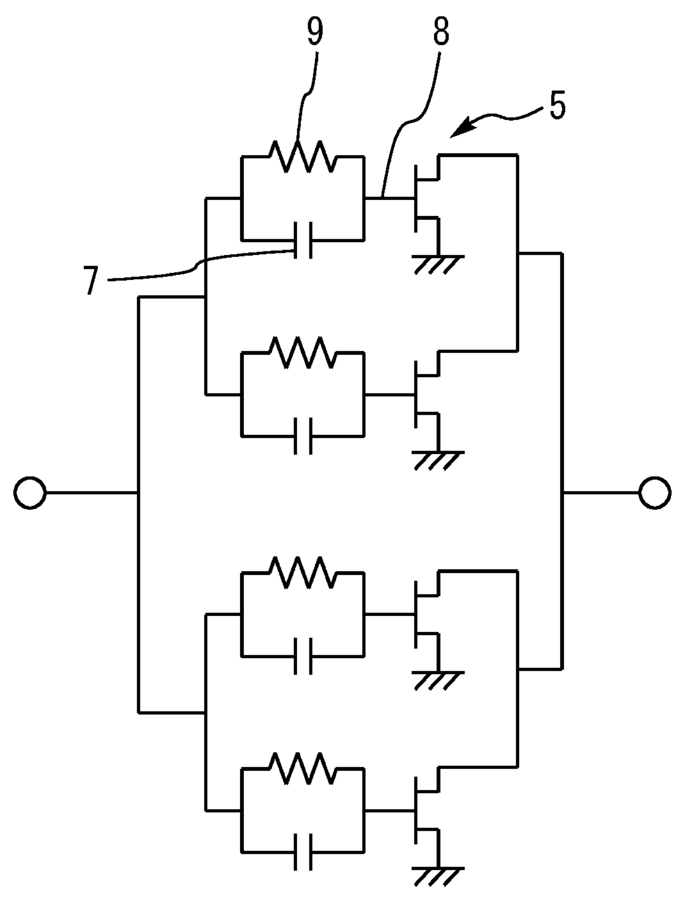
FIG. 4 is a circuit diagram of the high frequency transistor according to the comparative example.

Subsequently, effects of this embodiment are explained in comparison with a comparative example. FIG. 3 is a sectional view illustrating a high frequency transistor according to the comparative example. FIG. 4 is a circuit diagram of the high frequency transistor according to the comparative example. In the comparative example, the pads 10 and 11 and the silicon substrate 12 are not provided. A nonuniform temperature distribution in which the unit transistor 5 arranged in the center among the plurality of unit transistors 5 arranged in a row has high temperature and the unit transistors 5 at both ends have low temperature occurs. Since characteristics of a transistor change according to temperature, the plurality of unit transistors 5 nonuniformly operate and cause deterioration in power added efficiency and the like. If the nonuniformity of the temperatures becomes marked, the unit transistor 5 in the center has extremely high temperature and can be damaged.

In contrast, in this embodiment, the pads 13 and 14 are electrically connected to each other via a lower surface layer section of the silicon substrate 12 heated by heat from the unit transistor 5 corresponding to the silicon substrate 12. Accordingly, since the path 17 is connected in parallel to the resistor 9, the resistance value of the resistor configuring the stabilization circuit decreases and the high frequency signal further attenuates. Since this operation more conspicuously occurs in the unit transistor 5 in the center having high temperature and the stabilization circuit of the unit transistor 5, the plurality of unit transistors 5 approach the same temperature. Therefore, it is possible to suppress nonuniformity of the temperatures of the plurality of unit transistors 5. Accordingly, it is possible to improve transistor performance such as power added efficiency.

If the bias circuits including the thermistors are provided in all the unit transistors as in the related art, the area of the semiconductor substrate increases by several hundred to several thousand microns square in total. In contrast, in this embodiment, since the pads 10 and 11 of several ten microns square on which the gold bumps 15 and 16 are mounted only have to be provided on the semiconductor substrate 1, an increase in the area of the expensive semiconductor substrate 1 of silicon carbide, gallium nitride, or the like is only a little. Accordingly, it is possible to improve transistor performance while suppressing a cost rise.

Note that, in this embodiment, it is unnecessary to strictly predict a temperature rise amount at an operation time of the unit transistors 5. The temperatures of the plurality of unit transistors 5 automatically approach the uniform temperature without depending on situations such as an environmental temperature and a bias voltage. Since this embodiment does not depend on a type and a configuration of a bias circuit that drives a transistor, it is possible to freely select a type and a configuration of the bias circuit.

When it is desired to suppress a decrease amount of a gain of the entire high frequency transistor, the pads 10 and 11 and the gold bumps 15 and 16 may be provided in only the stabilization circuit connected to the unit transistor 5 in the center. That is, the pads 10 and 11 and the gold bumps 15 and 16 only have to be provided in the stabilization circuit connected to at least the unit transistor 5 in the center among the plurality of unit transistors 5 arranged in a row.

Note that a resistance value of the resistor 9 of the stabilization circuit in which an attenuation ratio of a high frequency signal changes to a decreasing tendency depends on a frequency of the high frequency signal, a capacitance value of the capacitor 7 of the stabilization circuit, load impedance around the stabilization circuit, and the like. If the frequency of the high frequency signal is 10 gigahertz and the capacitance value of the capacitor 7 of the stabilization circuit is 10 picofarads, the attenuation ratio of the high frequency signal decreases inversely when the resistance value of the resistor 9 of the stabilization circuit decreases to approximately 1 ohm. Therefore, for the attenuation ratio of the high frequency signal to change to the decreasing tendency, the resistance of the path 17 formed inside the silicon substrate 12 needs to decrease to at least the order of 1 ohm. However, actually, the resistance value of the path 17 of the silicon substrate 12 does not decrease to the order of 1 ohm. For example, it is assumed that the pads 13 and 14 are brought close to each other to 20 micrometers and the path 17, the sectional area of which is 1000 square micrometers, is formed. In this case, for the resistance of the path 17 to decrease to 1 ohm, the conductivity of the silicon substrate 12 needs to rise to 20,000 siemens/meter. If true carrier concentration and conductivity in silicon are calculated using a band gap 1.1 electron volt of the silicon, the calculated conductivity reaches the conductivity described above if the silicon substrate 12 is heated to approximately 1000 degrees Celsius. However, temperature at the time when a transistor generates heat and causes damage is approximately 300 degrees Celsius at most. The silicon substrate 12 is not heated to 1000 degrees Celsius. In this way, the temperature of the transistor does not rise to temperature at which a decrease in the attenuation ratio of the high frequency signal starts. Therefore, in this embodiment, reversal of the attenuation ratio from an increase to a decrease does not have to be considered.

A semiconductor chip forming the high frequency transistor is encapsulated in a package made of metal or the like for the purpose of, for example, preventing intrusion of moisture. In most cases, the metal package has an area several times or more as large as the area of the semiconductor chip. In recent years, a package obtained by bonding a semiconductor chip and a silicon substrate with a gold bump has been manufactured. The package has the same area as the area of the semiconductor chip and is called wafer-level chip-size package. A gold wall for preventing intrusion of moisture is formed by mounting gold bumps without gaps in the outer periphery of the semiconductor chip. In this embodiment as well, gold bumps through which an electric signal does not pass may be mounted without gaps to bond the outer periphery of the semiconductor substrate 1 and the outer periphery of the silicon substrate 12 to each other. On the other hand, if an entire apparatus is sealed by the metal package, the gold bumps in the outer periphery of the semiconductor chip is not always necessary.

Second Embodiment

Figure 5:
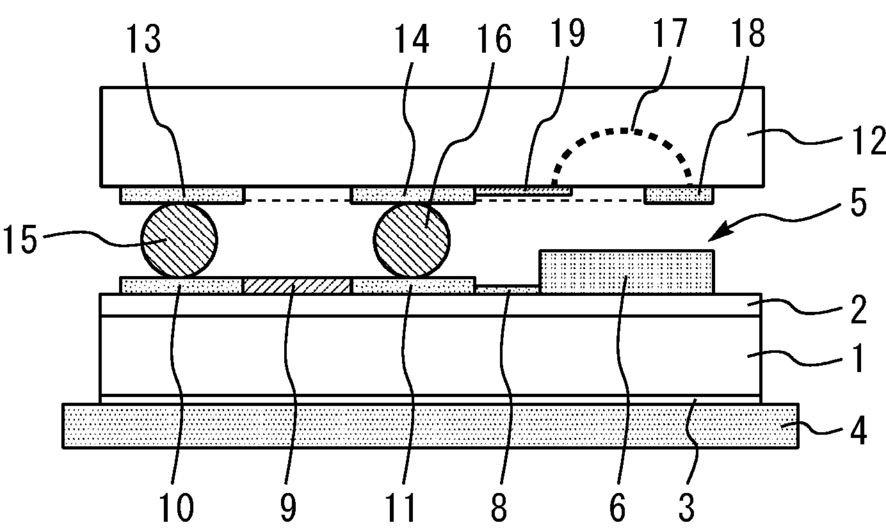
FIG. 5 is a sectional view illustrating a high frequency transistor according to a second embodiment.
Figure 6:
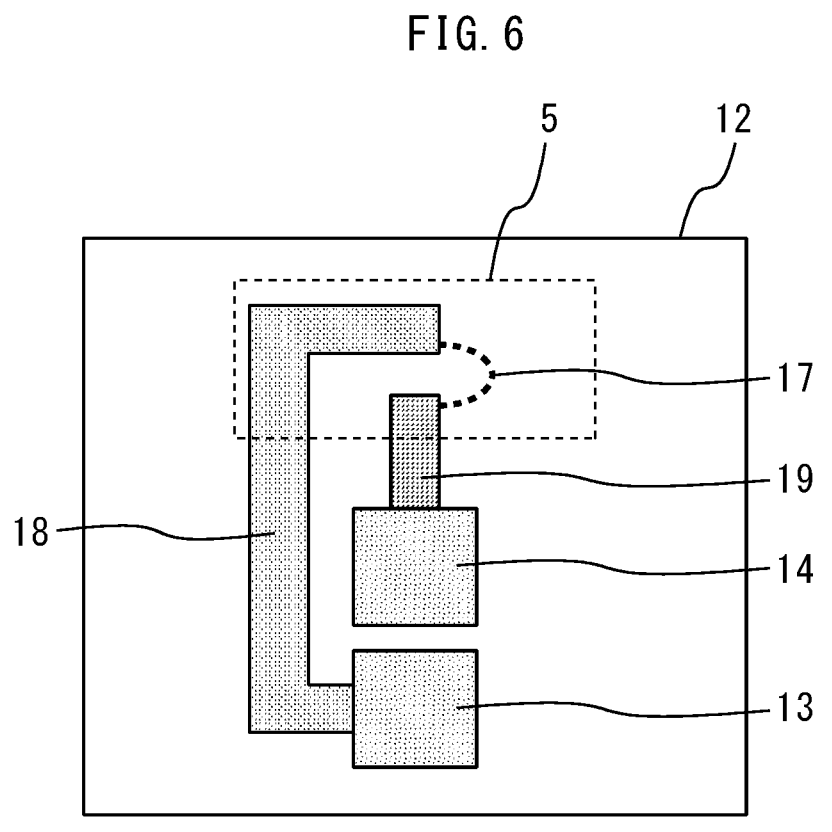

FIG. 5 is a sectional view illustrating a high frequency transistor according to a second embodiment. FIG. 6 is a bottom view illustrating a silicon substrate according to the second embodiment. A region surrounded by a broken line in FIG. 6 indicates a position where the unit transistor 5 covered by the silicon substrate 12 is arranged.

Wiring metals 18 and 19 are provided on the lower surface of the silicon substrate 12 and arranged not to be in contact with each other. One end of the wiring metal 18 is connected to the pad 13. One end of the wiring metal 19 is connected to the pad 14. The other end of the wiring metal 18 and the other end of the wiring metal 19 are arranged right above the unit transistor 5 corresponding to the wiring metals 18 and 19, are set in contact with the lower surface of the silicon substrate 12, and are separated from and face each other.

Since the gold bumps 15 and 16 are spheres, the diameter of which is several ten microns, the interval between the unit transistor 5 and the silicon substrate 12 is also approximately several ten microns. Air is present between the unit transistor 5 and the silicon substrate 12. Although the air has low thermal conductivity, since the unit transistor 5 and the silicon substrate 12 are close to each other, heat is transmitted from the unit transistor 5 to the silicon substrate 12 via the air. Therefore, the temperature of the lower surface layer section of the silicon substrate 12 present right above the unit transistor 5 sensitively reacts to a temperature rise of the unit transistor 5.

The other end of the wiring metal 18 and the other end of the wiring metal 19 are electrically connected to each other via the lower surface layer section of the silicon substrate 12 heated by heat from the unit transistor 5 corresponding to the wiring metals 18 and 19. Accordingly, as in the first embodiment, the function of suppressing nonuniformity of the temperatures of the plurality of unit transistors 5 is exerted. Note that, if the diameter of the gold bumps 15 and 16 is adjusted, it is also possible to adjust temperature at which the temperature uniformizing function starts to operate.

One of factors determining a resistance value of the path 17 between the other end of the wiring metal 18 and the other end of the wiring metal 19 is the length of the path 17. In the first embodiment, the length of the path 17 is the interval between the pads 10 and 11 and is generally determined by the length of the resistor 9. On the other hand, in this embodiment, the length of the path 17 is the distance of a part where the other end of the wiring metal 18 and the other end of the wiring metal 19 are closest to each other. Therefore, it is possible to adjust the length and the resistance value of the path 17 by changing the shapes of the wiring metals 18 and 19. It is possible to reduce the resistance value of the path 17 by setting the wiring metals 18 and 19 close to each other within a range allowed by a process rule. Note that the distance of the part where the other end of the wiring metal 18 and the other end of the wiring metal 19 are closest to each other is, for example, 1 to 2 microns or more.

It is also possible to change the distance between a formation part of the path 17 and a transistor by changing the shapes of the wiring metals 18 and 19. This makes it also possible to change the temperature of the unit transistor 5 at which the operation of the temperature uniformizing function starts. Note that the shapes of the wiring metals 18 and 19 do not need to be the same for all the unit transistors 5. For example, by arranging the formation part of the path 17 right above a heat generation part in the unit transistor 5 in the center and separating the formation part of the path 17 from the heat generation part in the unit transistors 5 at both the ends, it is possible to more strongly cause a gain decrease in the unit transistor 5 in the center.

Third Embodiment

Figure 7:
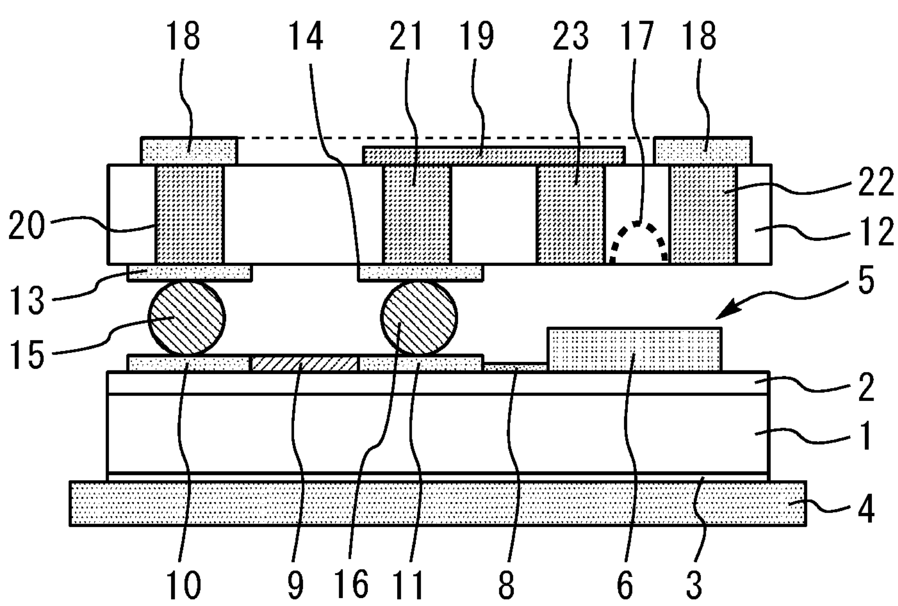
FIG. 7 is a sectional view illustrating a high frequency transistor according to a third embodiment.
Figure 8:
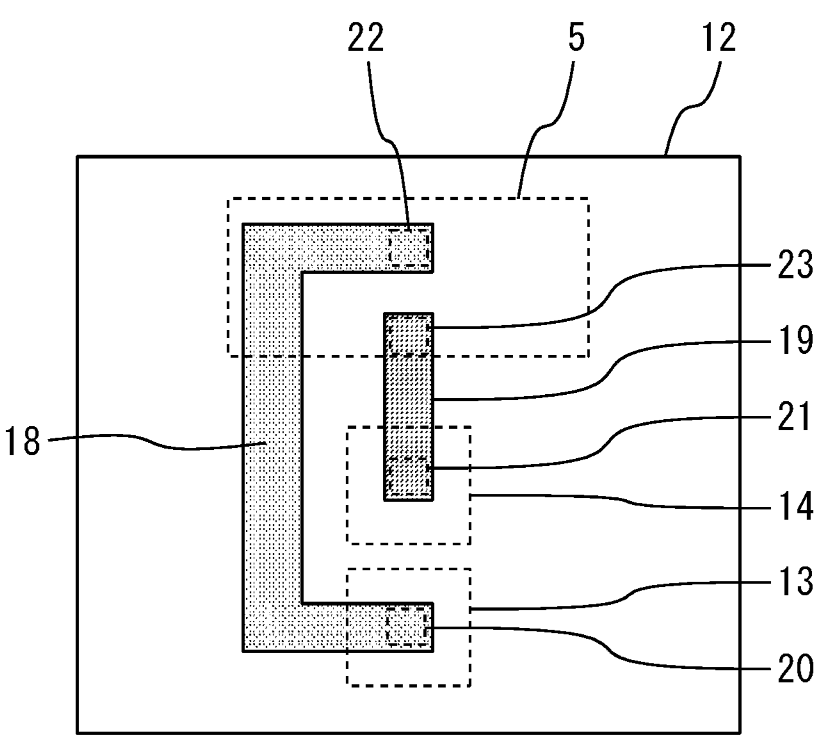
FIG. 8 is a top view illustrating a silicon substrate according to the third embodiment.

FIG. 7 is a sectional view illustrating a high frequency transistor according to a third embodiment. FIG. 8 is a top view illustrating a silicon substrate according to the third embodiment. The wiring metals 18 and 19 are formed on the upper surface of the silicon substrate 12 and arranged not to be in contact with each other.

The silicon substrate 12 is machined to form through-holes piercing through the silicon substrate 12 from the upper surface to the lower surface. Vias 20 to 23 are columnar metal filling the insides of the through-holes vertically piercing through the silicon substrate 12 or cylindrical metal plated on the side surfaces of the through-holes.

The via 20 connects one end of the wiring metal 18 on the substrate upper surface and the pad 13 on the substrate lower surface. The via 21 connects one end of the wiring metal 19 on the substrate upper surface and the pad 14 on the substrate lower surface. The upper end of the via 22 is connected to the other end of the wiring metal 18. The upper end of the via 23 is connected to the other end of the wiring metal 19.

The lower end of the via 22 and the lower end of the via 23 are arranged, on the lower surface of the silicon substrate 12, right above the unit transistor 5 corresponding to the via 22 and the via 23, are in contact with the silicon substrate 12, and are separated from and face each other. The other components are the same as the components in the first or second embodiment.

The lower end of the via 22 and the lower end of the via 23 are electrically connected to each other via the lower surface layer section of the silicon substrate 12 heated by heat from the unit transistor 5 corresponding to the via 22 and the via 23. Accordingly, as in the first embodiment, the function of suppressing nonuniformity of the temperatures of the plurality of unit transistors 5 is exerted.

Wire bonding is facilitated by forming the wiring metals 18 and 19 on the upper surface of the silicon substrate 12. For example, by performing wire bonding to wiring metal on a substrate upper surface, it is possible to input a high frequency signal or a gate bias voltage to a transistor not from a pad but from a wire above the transistor. Accordingly, flexibility of a method of mounting the high frequency transistor on communication equipment or a radar apparatus increases.

By forming the wiring metals 18 and 19 on the upper surface of the silicon substrate 12, it is possible to add a surface mounted device such as a chip resistor or a chip capacitor. Therefore, even after a wafer-level chip-size package is manufactured and the semiconductor substrate 1 is covered with the silicon substrate 12, it is possible to change a resistance value or a capacitance value of a stabilization circuit.

Note that one of the wiring metals 18 and 19 may be formed on the upper surface of the silicon substrate 12 and the other may be formed on the lower surface of the silicon substrate 12. That is, if the pad 13, the wiring metal 18, and the vias 20 and 22 are assumed to be a first conductor and the pad 14, the wiring metal 19, and the vias 21 and 23 are assumed to be a second conductor, a part of the first conductor or the second conductor only has to extend to the upper surface of the silicon substrate 12.

Although the preferred embodiments and the like have been described in detail above, the present disclosure is not limited to the above-described embodiments and the like, but the above-described embodiments and the like can be subjected to various modifications and replacements without departing from the scope described in the claims. Aspects of the present disclosure will be collectively described as supplementary notes.

Supplementary Note 1

A high frequency transistor comprising:

a semiconductor substrate;

a plurality of unit transistors provided on the semiconductor substrate and connected in parallel to one another;

a plurality of capacitors respectively connected to gate electrodes of the plurality of unit transistors;

a plurality of resistors respectively connected to the plurality of capacitors in parallel;

first and second pads provided on an upper surface of the semiconductor substrate and respectively connected to one end and the other end of the resistor connected to at least the unit transistor in the center among the plurality of unit transistors arranged in a row;

a silicon substrate arranged above the semiconductor substrate;

first and second conductors provided on the silicon substrate;

a first bump connecting the first pad and one end of the first conductor; and a second bump connecting the second pad and one end of the second conductor, wherein the other end of the first conductor and the other end of the second conductor are set in contact with the silicon substrate and are separated from and face each other.

Supplementary Note 2

The high frequency transistor according to Supplementary Note 1, wherein the other end of the first conductor and the other end of the second conductor are electrically connected to each other via the silicon substrate heated by heat from the corresponding unit transistor.

Supplementary Note 3

The high frequency transistor according to Supplementary Note 1 or 2, wherein the other end of the first conductor and the other end of the second conductor are arranged right above the corresponding unit transistor.

Supplementary Note 4

The high frequency transistor according to any one of Supplementary Notes 1 to 3, wherein a part of the first conductor or the second conductor extends to an upper surface of the silicon substrate.

REFERENCE SIGNS LIST

1 semiconductor layer; 5 unit transistor; 6 gate electrode; 7 capacitor; 9 resistor; 10,11,13,14 pad; 12 silicon substrate 15,16 gold bump; 18,19 wiring metal; 20~23 via.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2024-10909, filed on Jan. 29, 2024 including specification, claims, drawings and summary, on which the convention priority of the present application is based, is incorporated herein by reference in its entirety.

The invention claimed is:

1. A high frequency transistor comprising:

a semiconductor substrate;

a plurality of unit transistors provided on the semiconductor substrate and connected in parallel to one another;

a plurality of capacitors respectively connected to gate electrodes of the plurality of unit transistors;

a plurality of resistors respectively connected to the plurality of capacitors in parallel;

first and second pads provided on an upper surface of the semiconductor substrate and respectively connected to one end and the other end of the resistor connected to at least the unit transistor in the center among the plurality of unit transistors arranged in a row;

a silicon substrate arranged above the semiconductor substrate;

first and second conductors provided on the silicon substrate;

a first bump connecting the first pad and one end of the first conductor; and a second bump connecting the second pad and one end of the second conductor, wherein the other end of the first conductor and the other end of the second conductor are set in contact with the silicon substrate and are separated from and face each other.

2. The high frequency transistor according to claim 1, wherein the other end of the first conductor and the other end of the second conductor are electrically connected to each other via the silicon substrate heated by heat from the corresponding unit transistor.

3. The high frequency transistor according to claim 1, wherein the other end of the first conductor and the other end of the second conductor are arranged right above the corresponding unit transistor.

4. The high frequency transistor according to claim 2, wherein the other end of the first conductor and the other end of the second conductor are arranged right above the corresponding unit transistor.

5. The high frequency transistor according to claim 1, wherein a part of the first conductor or the second conductor extends to an upper surface of the silicon substrate.

6. The high frequency transistor according to claim 2, wherein a part of the first conductor or the second conductor extends to an upper surface of the silicon substrate.

7. The high frequency transistor according to claim 3, wherein a part of the first conductor or the second conductor extends to an upper surface of the silicon substrate.

8. The high frequency transistor according to claim 4, wherein a part of the first conductor or the second conductor extends to an upper surface of the silicon substrate.

* * * * *